United States Patent
Sudarshan et al.

(10) Patent No.: US 9,842,898 B2
(45) Date of Patent: Dec. 12, 2017

(54) METHODS OF GROWING A SILICON CARBIDE EPITAXIAL LAYER ON A SUBSTRATE TO INCREASE AND CONTROL CARRIER LIFETIME

(71) Applicants: Tangali S. Sudarshan, Columbia, SC (US); Amitesh Srivastava, Hillsboro, OR (US)

(72) Inventors: Tangali S. Sudarshan, Columbia, SC (US); Amitesh Srivastava, Hillsboro, OR (US)

(73) Assignee: University of South Carolina, Columbia, SC (US)

( * ) Notice: Subject to any disclaimer, the term of this patent is extended or adjusted under 35 U.S.C. 154(b) by 545 days.

(21) Appl. No.: 14/045,334

(22) Filed: Oct. 3, 2013

(65) Prior Publication Data

US 2014/0231826 A1 Aug. 21, 2014

Related U.S. Application Data

(62) Division of application No. 12/876,729, filed on Sep. 7, 2010, now Pat. No. 8,574,528.

(60) Provisional application No. 61/239,922, filed on Sep. 4, 2009.

(51) Int. Cl.
| | |
|---|---|
| *C30B 25/10* | (2006.01) |
| *C30B 25/16* | (2006.01) |
| *C30B 25/18* | (2006.01) |
| *H01L 21/02* | (2006.01) |
| *H01L 29/16* | (2006.01) |
| *C30B 29/36* | (2006.01) |

(52) U.S. Cl.
CPC .......... *H01L 29/1608* (2013.01); *C30B 25/10* (2013.01); *C30B 25/16* (2013.01); *C30B 25/18* (2013.01); *C30B 29/36* (2013.01); *H01L 21/0262* (2013.01); *H01L 21/02529* (2013.01)

(58) Field of Classification Search
None
See application file for complete search history.

(56) References Cited

U.S. PATENT DOCUMENTS

| | | |
|---|---|---|
| 5,363,800 A | 11/1994 | Larkin et al. |
| 5,915,194 A | 6/1999 | Powell et al. |
| 6,193,797 B1 | 2/2001 | Shiomi et al. |
| 6,237,950 B1 | 5/2001 | Cook et al. |

(Continued)

OTHER PUBLICATIONS

Hassan et al.; Influence of Structural Defects on Carrier Lifetime in 4H—SiC Epitaxial Layers: Optical Lifetime Mapping; Journal of Applied Physics; 105, 123518; 2009.*

(Continued)

*Primary Examiner* — Guinever S Gregorio
(74) *Attorney, Agent, or Firm* — Dority & Manning, PA

(57) ABSTRACT

A method of growing an epitaxial layer on a substrate is generally provided. According to the method, the substrate is heated in a chemical vapor deposition chamber to a growth temperature in the presence of a carbon source gas, then the epitaxial layer is grown on the substrate at the growth temperature, and finally the substrate is cooled in a chemical vapor deposition chamber to at least about 80% of the growth temperature in the presence of a carbon source gas. Substrates formed from this method can have a carrier lifetime between about 0.25 μs and about 9.9 μs.

6 Claims, 5 Drawing Sheets

(56) References Cited

U.S. PATENT DOCUMENTS

| | | | |
|---|---|---|---|
| 6,270,573 B1 | 8/2001 | Kitabatake et al. | |
| 6,329,088 B1 | 12/2001 | Landini et al. | |
| 6,391,109 B2 | 5/2002 | Shiomi et al. | |
| 6,416,578 B1 | 7/2002 | Nakano et al. | |
| 6,475,456 B2 | 11/2002 | Nakano et al. | |
| 7,166,523 B2 | 1/2007 | Nagasawa | |
| 7,618,880 B1 * | 11/2009 | Quick | H01L 21/02381 438/478 |
| 7,811,914 B1 * | 10/2010 | Quick | H01L 21/02381 257/E21.333 |
| 2003/0079689 A1 | 5/2003 | Sumakeris et al. | |
| 2006/0099750 A1 * | 5/2006 | DeHeer | H01L 21/0405 438/194 |
| 2006/0107890 A1 | 5/2006 | Hobgood et al. | |
| 2009/0114924 A1 | 5/2009 | Ellison et al. | |
| 2009/0126624 A1 | 5/2009 | Syvajarvi et al. | |
| 2009/0223447 A1 | 9/2009 | Hara | |
| 2009/0294759 A1 * | 12/2009 | Woo | B82Y 10/00 257/29 |
| 2009/0302326 A1 | 12/2009 | Maruyama | |
| 2010/0006859 A1 | 1/2010 | Chung et al. | |
| 2010/0288188 A1 | 11/2010 | Terashima et al. | |

OTHER PUBLICATIONS

Wagner et al. Surface Preparation of 4H—SiC Substrates for Hot-Wall CVD of SiC Layers; Applied Surface Science; 184, 55-59; 2001.

* cited by examiner

US 9,842,898 B2

METHODS OF GROWING A SILICON CARBIDE EPITAXIAL LAYER ON A SUBSTRATE TO INCREASE AND CONTROL CARRIER LIFETIME

PRIORITY INFORMATION

The present application claims priority to, and is a divisional application of, U.S. patent application Ser. No. 12/876,729 of Sudarshan, et al. titled "Methods of Growing a Silicon Carbide Epitaxial Layer on a Substrate to Increase Control Carrier Lifetime" filed on Sep. 7, 2010, which claims priority to U.S. Provisional Patent Application Ser. No. 61/239,922 filed on Sep. 4, 2009 titled "Method to Increase and Control Carrier Lifetime in Silicon" of Sudarshan, et al.; the disclosures of which are incorporated by reference herein.

GOVERNMENT SUPPORT CLAUSE

The present invention was developed with funding from the Office of Naval Research under award n00014-06-1143. The government retains certain rights in this invention.

BACKGROUND

Carrier lifetime is one of the most important characteristics of semiconductor devices. The measurement of the carrier lifetime can be used as a monitor of the quality of epitaxial films, because it provides information about the point defect density in the semiconductor. In order to reduce the on-state resistance, the carrier lifetime must be high. A long carrier lifetime is required for effective conductivity modulation. But too long a lifetime will cause considerably long reverse recovery, leading to limited switching frequency and excessive switching loss. Therefore, carrier lifetimes need to be controlled to achieve optimum lifetime values depending upon the final application. It is therefore very important to have a controlled process where we can achieve a short or long lifetime depending upon the application. However, no method for controlling or improving the carrier lifetime using the Chemical Vapor Deposition (CVD) has been reported.

In fact, even today's high quality SiC epilayers still contain impurities and intrinsic defects acting as carrier traps or recombination centers. These defects degrade the minority carrier lifetime that is required to achieve a low on-state voltage drop for high voltage bipolar power devices. CVD growth in SiC is generally performed using silane and propane, with SiC-coated graphite parts used as the material for the susceptor and hot wall. However, SiC-coated graphite susceptors release impurities like Titanium (Ti), Boron (B), and Aluminum (Al) during CVD growth, and these impurities are electrically active, acting as traps, and thus degrading the carrier lifetime. It has also been suggested that susceptor material plays a critical role in reducing the background impurity concentration since the aforementioned impurity also follows the site-competition principle.

For high voltage bipolar devices, the minority carrier lifetime determines the level of base modulation and, consequently, the residual voltage drop across a device at high current densities. High voltage SiC power devices possess great promise in terms of lower on-resistance owing to the effect of conductivity modulation. However, the lifetime of SiC epilayers typically falls within the range of <0.05-5 μs. Thus, there is a need to increase the carrier lifetime in as-grown epilayers and to reduce the forward voltage drop.

However, it is not desirable to have a lifetime that is too long because it will cause considerably longer reverse recovery, thereby limiting the switching frequency. Furthermore, long lifetimes will also cause excessive switching losses in the case of unipolar devices.

As such, a need exists for the ability to vary the carrier lifetime in as-grown epilayers in order to form an epilayer having the desired carrier lifetime.

SUMMARY

Objects and advantages of the invention will be set forth in part in the following description, or may be obvious from the description, or may be learned through practice of the invention.

Methods are generally provided for growing a silicon carbide epitaxial layer on a substrate. The substrate can be heated to a growth temperature in a temperature increase atmosphere including a first carbon source gas. The silicon carbide epitaxial layer can then be grown on the substrate at the growth temperature in a growth atmosphere including a silane source gas. Then, the substrate can be cooled to at least about 80% of the growth temperature in a temperature decrease atmosphere including a second carbon source gas.

Substrates including a silicon carbide epitaxial layer grown according to the presently disclosed methods are also generally provided, and can have a carrier lifetime between about 0.25 μs and about 9.9 μs.

Other features and aspects of the present invention are discussed in greater detail below.

BRIEF DESCRIPTION OF THE DRAWINGS

A full and enabling disclosure of the present invention, including the best mode thereof to one skilled in the art, is set forth more particularly in the remainder of the specification, which includes reference to the accompanying figures, in which.

Figure 1:
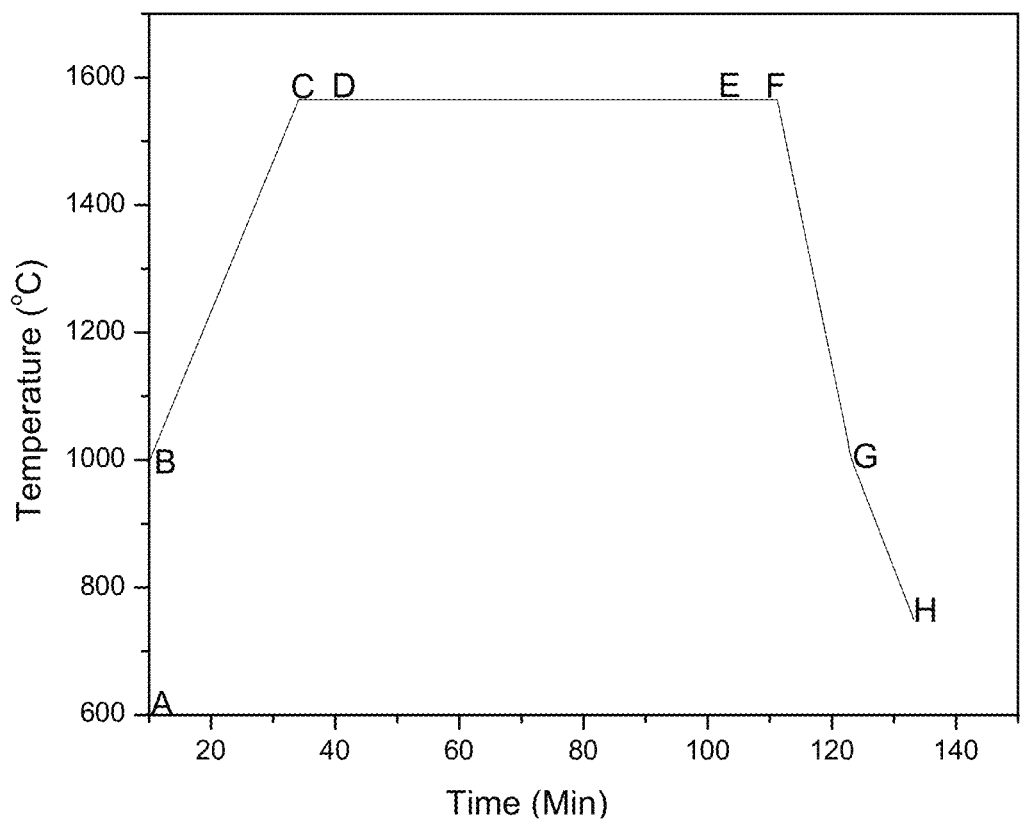
FIG. 1 shows the temperature profile of process A to achieve long lifetime.

Repeat use of reference characters in the present specification and drawings is intended to represent the same or analogous features or elements of the present invention.

DETAILED DESCRIPTION

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention.

For instance, features illustrated or described as one embodiment can be used on another embodiment to yield still a further embodiment. Thus, it is intended that the present invention cover such modifications and variations as come within the scope of the appended claims and their equivalents. It is to be understood by one of ordinary skill in the art that the present discussion is a description of exemplary embodiments only, and is not intended as limiting the broader aspects of the present invention, which broader aspects are embodied exemplary constructions.

Generally speaking, the present disclosure is directed to the development of SiC epitaxial layers for bipolar devices. The SiC epitaxial layers can generally be formed to selectively control and vary the carrier lifetime of the layer between about 0.25 μs and about 9.9 μs, such as from about 1 μs to about 9.5 μs. In some embodiments, the SiC epitaxial layers can be formed to selectively control and vary the carrier lifetime of the layer between about 5 μs and about 9 μs.

Control of the carrier lifetime (e.g., increasing the carrier lifetime of regular CVD epitaxial layers) of epitaxial layers can be achieved through a specific method of forming the epitaxial layer on the substrate via a modified CVD process. This method involves providing a carbon rich atmosphere during the temperature increase before growth of the epitaxial layer (i.e., the "temperature increase atmosphere") and during the temperature decrease after growth of the epitaxial layer (i.e., the "temperature decrease atmosphere"). Without wishing to be bound by theory, it is believed that this carbon rich atmosphere allows carbon to accumulate on the surface of the substrate prior to the formation of the epitaxial layer, which can then diffuse into the substrate and/or epitaxial layer filling any defects (especially those defects formed when impurities are released from the substrate and/or epitaxial at the elevated formation temperature experienced in CVD processes). Another possibility includes passivating defects to kill surface recombination.

For example, the epitaxial layer can be grown via CVD at growth temperatures of greater than about 1400° C. in a conventional CVD chamber. During heating in the CVD chamber, the substrate can be exposed to a temperature increase atmosphere containing a carbon source gas to accumulate carbon on the surface of the substrate prior to epitaxial growth at the growth temperature. For example, the substrate can be exposed to the temperature increase atmosphere during the final stages of heating prior to epitaxial growth, such as from about 50% of the growth temperature until the temperature reaches the desired growth temperature. In some embodiments, the substrate can be exposed to the temperature increase atmosphere from about 70% of the growth temperature until reaching the desired growth temperature, such as from about 80% of the growth temperature.

For instance, when the target epitaxial growth temperature is about 1400° C. to about 1650° C. (e.g., about 1500° C. to about 1600° C.), the substrate can be exposed to the temperature increase atmosphere until reaching the target epitaxial growth temperature, such as from about 1000° C. (e.g., from about 800° C. or greater) up to the growth temperature.

As stated, the temperature increase atmosphere contains a first carbon source gas (e.g., methane, ethane, propane, etc.). In addition, the temperature increase atmosphere can include a carrier gas. In one particular embodiment, the temperature increase atmosphere is substantially free from a silane source, such as consisting essentially of the first carbon source gas and the optional carrier gas (i.e., substantially free from all other reactive gases). However, in alternative embodiments, a silane source gas may also be present in the temperature increase atmosphere, as desired.

Optionally, pre-growth etching can be performed at the growth temperature prior to formation of the SiC epitaxial layer. For example, the substrate can be exposed to an etchant gas at the growth temperature.

Once the growth temperature is reached, the silicon carbide epitaxial layer can then be grown according to conventional CVD processes, such as discussed in greater detail below.

Optionally, post-growth annealing can be performed at the growth temperature after formation of the SiC epitaxial layer. For example, the substrate can be exposed to an annealing gas at the growth temperature (e.g. hydrogen).

Then, after the formation of the epitaxial layer and during cooling of the substrate, the substrate can be again exposed to a temperature decrease atmosphere containing a carbon source gas allowing for accumulation of carbon on the surface of the silicon carbide epitaxial layer. For example, the substrate and its newly grown silicon carbide epitaxial layer can be exposed to the temperature decrease atmosphere during the beginning stages of cooling after epitaxial growth, such as from the growth temperature until the temperature reaches about 80% of the growth temperature. In some embodiments, the substrate can be exposed to the temperature decrease atmosphere from the growth temperature until the temperature reaches the about 70% of the growth temperature, such as about 50% of the growth temperature.

For instance, when the epitaxial growth temperature is from about 1400° C. to about 1650° C., (e.g., about 1450° C. to about 1600° C.) the substrate can be exposed to the temperature decrease atmosphere during the cooling phase until the temperature reaches about 1200° C. or lower, such as about 1000° C. or lower (e.g., from about 800° C. or lower).

As stated, the temperature decrease atmosphere contains a second carbon source gas (e.g., methane, ethane, propane, etc.). In addition, the temperature decrease atmosphere can include a carrier gas. In one particular embodiment, the temperature decrease atmosphere is substantially free from a silane source, such as consisting essentially of the second carbon source gas and the optional carrier gas (i.e., substantially free from all other reactive gases). However, in alternative embodiments, a silane source gas may also be present in the temperature decrease atmosphere, as desired.

As such, during both the heating phase and the cooling phase, the substrate can be exposed to the carbon source with or without the presence of a silane source. In one particular embodiment, the substrate can be exposed to the carbon source during heating and/or cooling without the presence of a silane source. For example, in one embodiment, the substrate can be exposed to the carbon source and the optional carrier gas during both the heating phase and/or the cooling phase, while being substantially free from other gases (i.e., the temperature increase atmosphere consists essentially of the carbon source gas and a carrier gas and/or the temperature decrease atmosphere consists essentially of the carbon source gas and a carrier gas). As used herein, the term "substantially free" means no more than an insignificant trace amount present and encompasses completely free (e.g., 0 molar % up to 0.0001 molar %).

As stated, the epitaxial layer can be grown after heating the substrate to the growth temperature. In one embodiment, the epitaxial layer can be grown in a growth atmosphere including a silane source gas (e.g., silane, dichlorosilane, etc.), a third carbon source gas (e.g., methane, ethane, propane, etc.), and an optional carrier gas. For instance, the growth atmosphere can include a ratio of the third carbon source gas to the silane source gas that is about 5 to about 100 by gas flow rate, such as about 10 to about 50. Flow rates for gases can be measured, for example, in standard cubic centimeters per minute ("sccm") or standard liters per second ("slm"), which assumes a standard temperature (e.g., room temperature of about 20° C.) and a standard pressure (e.g., about 1 atmosphere).

Dopants, etchants, and other materials may be included in the growth atmosphere to be deposited into the epitaxial layer, as desired.

The CVD process can be carried out for a sufficient time to grow the epitaxial layer to the desired thickness. For example, in certain embodiments, the growth period can be about 30 minutes to about 5 hours, such as about 45 minute to about 3 hours. In particular embodiments, heating the substrate in the temperature increase atmosphere can be performed for about 10% to about 75% of the growth period (e.g., about 25% to about 50%), and cooling the substrate in the temperature decrease atmosphere can be performed for about 5% to about 50% of the growth period (e.g., about 10% to about 40%).

Deposition may be suitably conducted according to the various CVD methods known to those skilled in the art, including plasma-enhanced chemical vapor deposition (PECVD) or thermal CVD, utilizing a silane source gas and a carbon source gas to deposit a single crystalline Si-containing film onto a substrate within a CVD chamber. In some embodiments, the Si-containing film is a carbon-doped epitaxial Si film. In some embodiments, a gaseous chlorine-containing etchant (such as HCl or, more preferably, chlorine) can be introduced to the chamber in conjunction with the silane source gas and carbon source gas to thereby selectively deposit a single crystalline Si-containing film.

In the present disclosure, reference may be made to the use of a silane source gas to deposit a Si or Si-containing film. It will be recognized that those descriptions are also generally applicable to the deposition of other Si-containing films and to selective depositions (e.g., involving the use of an etchant source). Other dopant precursor(s) can optionally be included, including various materials that are precursors to various elements (e.g., carbon, germanium, boron, gallium, indium, arsenic, phosphorous, and/or antimony) that may be incorporated into the resulting deposited film in relatively minor amounts.

The silane source gas and the carbon source gas (and, optionally, an etchant gas and/or an electrical dopant precursor, in certain embodiments) can be introduced to the chamber in the form of separate gases or by intermixing to form a feed gas. The intermixing to form the feed gas may take place in the chamber (see e.g., FIG. 8) or prior to introduction of the feed gas to the chamber. The total pressure in the CVD chamber during epitaxial growth can range from about 0.001 Torr to about 1000 Torr, such as from about 0.1 Torr to about 400 Torr, most preferably in the range of about 50 Torr to about 350 Torr. In one particular embodiment, the CVD growth can be carried out at a growth temperature between about 1400° C. and about 1650° C. (e.g., from about 1450° C. to about 1600° C.) and a growth pressure of from about 200 Torr to about 400 Torr (e.g., from about 250 Torr to about 350 Torr).

Figure 7:
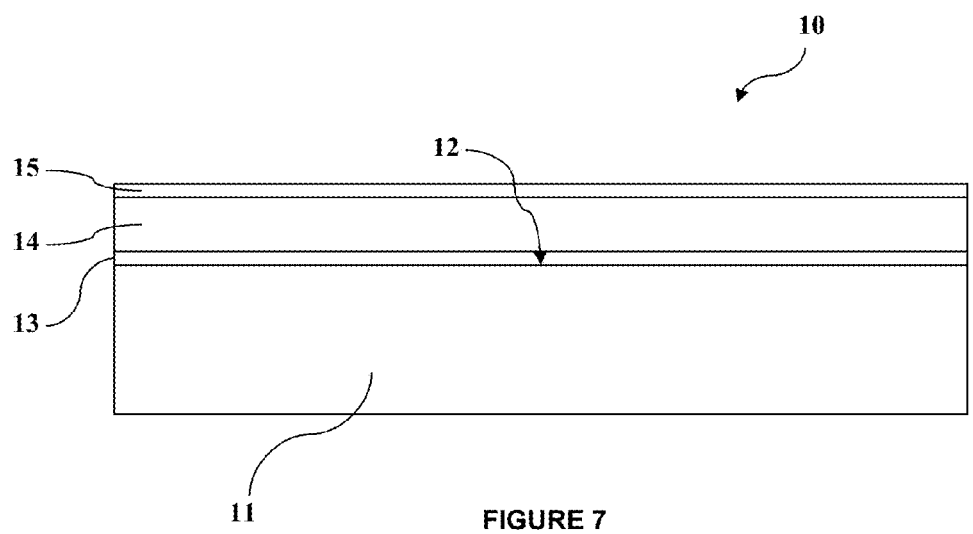
FIG. 7 shows an exemplary substrate formed according to one particular embodiment of the presently described method.

FIG. 7 shows an exemplary substrate 10 formed according to the above described method. The substrate body 11 has a first carbon deposit 13 on its surface 12 which was accumulated during the heating of the substrate body 11 in the CVD chamber in the presence of a carbon source (e.g., propane). The epitaxial layer 14 was grown at the growth temperature. Then, the second carbon deposit 15 was accumulated on the exposed surface of the epitaxial layer 14 during cooling of the substrate 10 after growth.

The substrate body 11 can formed from any suitable material. In particular embodiments, the substrate body 11 can be silicon carbide having any suitable crystal structure. For example, the substrate body 11 can be a silicon carbide having a hexagonal unit cell (wurtzile), such as 2H—SiC, 4H—SiC, or 6H—SiC.

The deposition methods can be conducted to process a single semiconductor wafer at a time, or to process multiple semiconductor wafer at one time. In one particular embodiment, the deposition methods can be conducted in a single chemical vapor deposition chamber.

Figure 8:
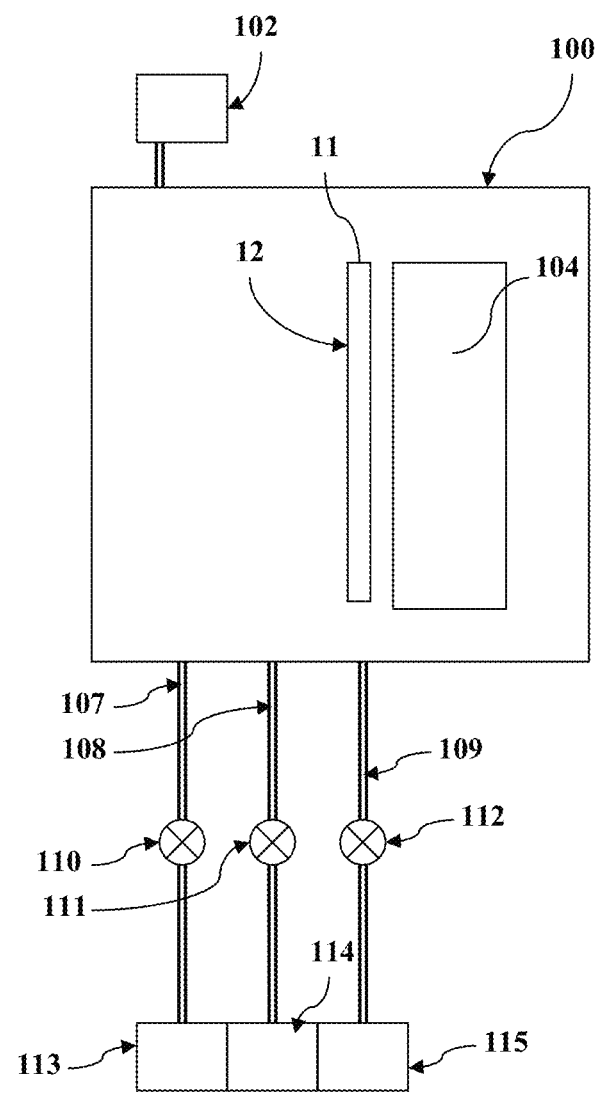
FIG. 8 shows an exemplary chemical vapor deposition chamber for use according to one particular embodiment.

FIG. 8 shows an exemplary chemical vapor deposition chamber 100 for use in one particular embodiment. A chamber pressure regulator 102 (e.g., a vacuum) is connected to the CVD chamber 100 to control the gas pressure inside the chamber 100, and purging of the chamber 100, when desired.

The substrate body 11 is shown inside the CVD chamber 100 and adjacent to the heat source 104. The heat source 104 can be any suitable heat source for use in conjunction with the CVD chamber 100, such as a susceptor. In one particular embodiment, the heat source 104 can be a graphite susceptor having a tantalum carbide coating (i.e., a TaC-coated graphite susceptor), which can provide an epitaxial layer having a higher carrier lifetime than when made according to an otherwise identical method except using a SiC-coated graphite susceptor.

The substrate body 11 has its surface 12 exposed for deposition of the epitaxial layers. The source material for the epitaxial layers can be provided as gas(es) to the CVD chamber 100 through the first source gas line 107, the second source gas line 108, and the third source gas line 109 from a first source tank 113, a second source tank 114, and a third source tank 115, respectively. The flow in the source gas lines 107, 108, 109 can be controlled via a first valve 110, a second valve 111, and a third valve 112, respectively. As such, the amount of each source gas can be regulated as desired.

For example, the first gas line 107 can provide a carbon source gas from the first source tank 113 to the chamber 100 during heating of the substrate body 11, growth of the epitaxial layer(s), and/or cooling of the substrate body 11. The second gas line 108 can provide a silane source gas from the second source tank 114 to the chamber 100 during heating of the substrate body 11, growth of the epitaxial layer(s), and/or cooling of the substrate body 11. In one particular embodiment, for instance, the second gas line 108 can provide a silane source gas from the second source tank 114 to the chamber 100 during only growth of the epitaxial layer(s), and not during heating or cooling of the substrate body 11, through control of the second valve 111. Dopant and/or etchant gases can be added to the chamber 100 through the third source line 109 from the third source tank 115 and controlled by the third valve 112.

Although shown with three source gas lines 107, 108, 109, it is understood that any number of source gas lines, along with their associated valves and source tanks, can be utilized in conjunction with the chamber 100. For example, a fourth gas line (not shown) can be utilized to provide an inert gas to the chamber 100 to regulate and control the pressure within the chamber 100.

Additionally, a carrier gas can be supplied into any of the source gas lines 107, 108, 109, either before or after the valve 110, 111, 112, to help control the flow of the source material into the chamber 100.

The carrier gas, such as hydrogen, argon, helium, nitrogen, other inert gases and mixtures thereof, can be used to control the flow of other gases to the CVD chamber and the pressure within the chamber. The chemical vapor deposition chamber can be, in one particular embodiment, kept at a relatively stable pressure throughout the heating, growing, and cooling process, such as from about 200 Torr to about 400 Torr (e.g., from about 250 Torr to about 350 Torr). The partial pressure of the carbon source can be from about 0.0001% to about 99% of the total pressure, such as from about 0.001% to about 50% of the total pressure, in any of the temperature increase atmosphere, growth atmosphere, and/or temperature decrease atmosphere.

EXAMPLES

Deep Level Transient Spectroscopy (DLTS) has revealed two major electron traps in n-type 4H—SiC epilayers: $Z_{1/2}$ and EH6/7. Recently, it has been shown that $Z_{1/2}$ dominates in limiting the carrier lifetime. Although the exact microscopic and electronic structure of these defects are still in discovery stage, they are suspected to be related to a defect (or complex) containing a carbon vacancy. Thus, any process which decreases the carbon vacancy and thus $Z_{1/2}$ concentration should increase the carrier lifetime. The key aspect of this new process described herein is the creation of a carbon rich atmosphere before the initiation and after the termination of epilayer growth. This process results in improvement as well as control of carrier lifetime. This technology creates carbon interstitials at the substrate/epilayer interface and also creates carbon interstitials at the end of the epitaxial growth process (on the top of the epilayer). These carbon interstitials will diffuse into the epilayer by the process of concentration gradient.

In this work the measurement of minority carrier lifetimes using the time resolved photoluminescence technique is generally reported. It was found that 4H—SiC homo-epilayers grown using chlorine-based precursors have longer carrier lifetimes if used in conjunction with a tantalum carbide coated (TaC-coated) graphite susceptor rather than a SiC-coated graphite susceptor. Longer carrier lifetimes were obtained by optimal combinations of precursor gases and susceptor type. The controllable variation in lifetime from 250 ns to 9.9 µs was demonstrated.

EXPERIMENTAL

The epitaxial growth was carried out in a home-built, vertical-hot-wall CVD chamber. Temperatures between 1400°-1650° C. were used during epitaxial growth, with the chamber kept at 300 Torr. Two kinds of susceptors were used in these experiments, SiC-coated susceptor and TaC-coated graphite susceptors. Silane, propane and dichlorosilane were used as precursor gases, while hydrogen was used as the carrier gas. In this study, we used commercial 4H—SiC (0001) substrates off-cut 8° towards, 8 mm by 8 mm in size. Carrier lifetimes were measured at room temperature from the decay of the band-edge photoluminescence (PL) peak at 391 nm. The PL was excited at 355 nm by a frequency-doubled, cavity-dumped Ti: sapphire laser generating <150 fsec pulses at 40-500 kHz with average pulse energy of ≈2 nJ, corresponding to an injection level of ≈$2 \times 10^{14}$ cm$^{-3}$. The steady-state band edge and visible PL at 2K were excited by the 244 nm line from a frequency-doubled Ar ion laser. The doping concentration of the epilayers was measured using mercury (Hg) probe C—V. Thermally stimulated current (TSC) measurements were performed in the low temperature range 90-320° K.

Figure 2:
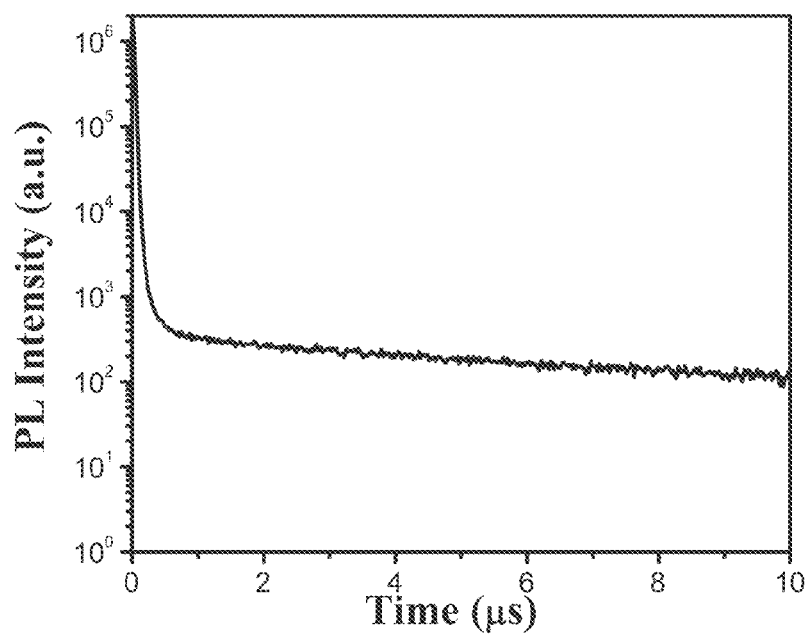
FIG. 2 shows the PL decay curve of sample A with a carrier lifetime of 9900 ns.

Time Resolved Photo Luminescence (TRPL) measurements were done at Naval Research Laboratory (NRL) to determine the carrier lifetime. FIG. 1 shows the temperature profile of process A to achieve long lifetime. FIG. 2 shows the PL decay curve of sample A with a carrier lifetime of 9900 ns. Table 1 shows the experimental details of process A where we achieved long carrier lifetime, along with temperature and gas flow details. The pressure during the growth was 300 Torr:

TABLE 1

| | | Gas Flow | | | | |
|---|---|---|---|---|---|---|
| Stage | Process | Temperature (° C.) | Time (min) | Silane/dichlorosilane effective flow rate (sccm) | Propane (slm) | Hydrogen (slm) |
| AB | Heating | 1000 | 10 | 0 | 0 | 6 |
| BC | Heating | 1550 | 24 | 0 | 0.022 | 6 |
| CD | Pre growth etching | 1550 | 5 | 0 | 0.022 | 6 |
| DE | Growth | 1550 | 60 | 3.5 | 0.05 | 6 |
| EF | Post Growth Annealing | 1550 | 5 | 0 | 0.022 | 6 |
| FG | Cooling | 1000 | 12 | 0 | 0.022 | 6 |
| GH | Cooling | 750 | 10 | 0 | 0.022 | 4 |

Figure 3:
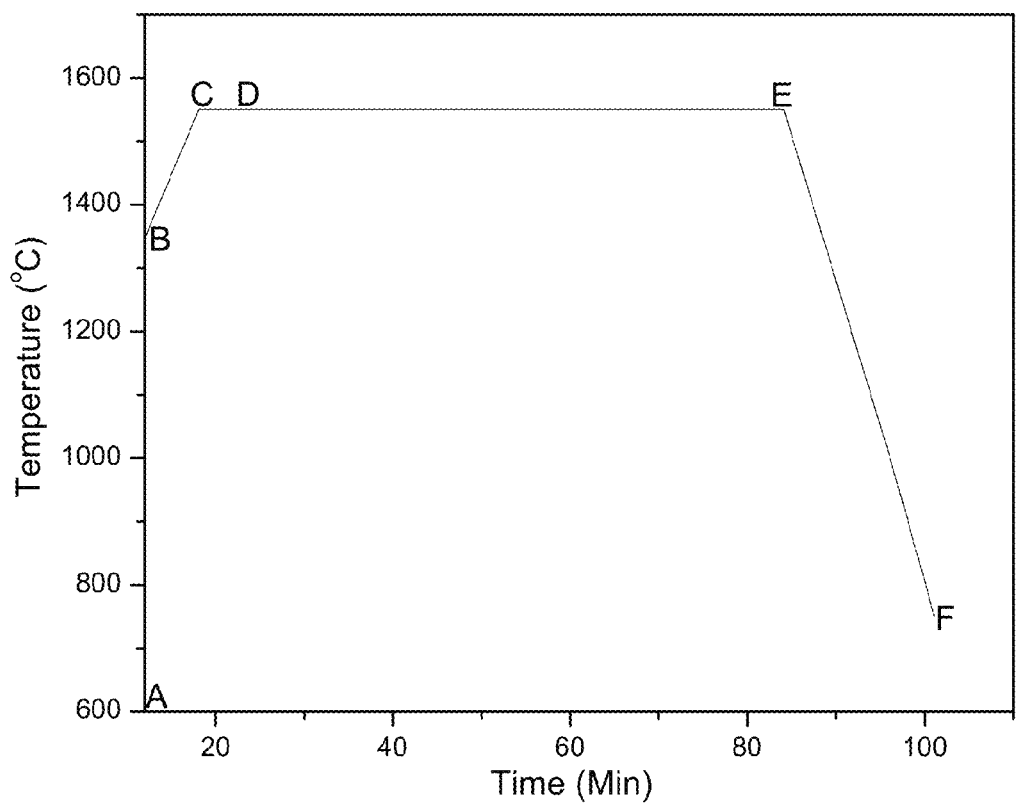
FIG. 3 shows the temperature profile of process B for short lifetime.
Figure 4:
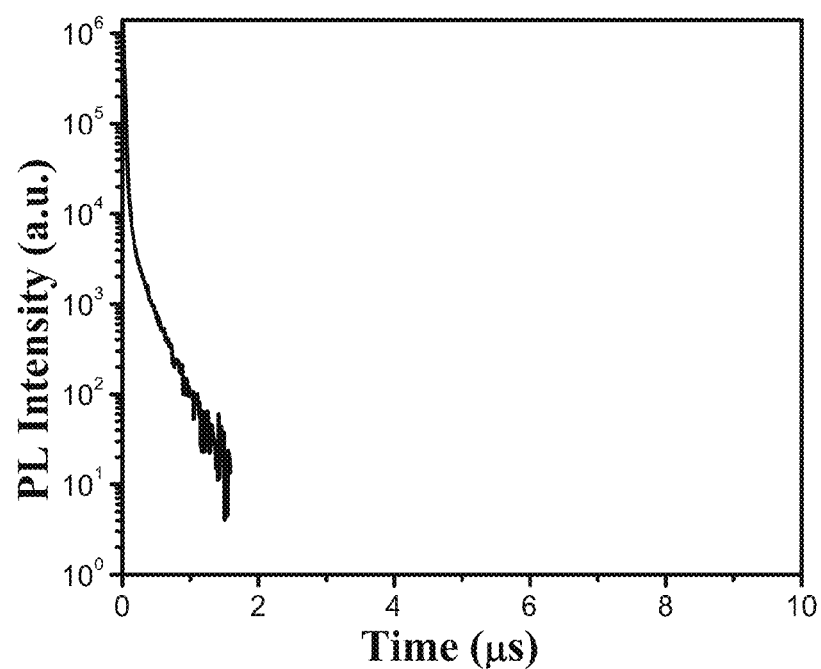
FIG. 4 shows the PL decay curve of sample B with a carrier lifetime of 247 ns.

FIG. 3 shows the temperature profile of process B for short lifetime. FIG. 4 shows the PL decay curve of sample B with a carrier lifetime of 247 ns. Table 2 shows the experimental detail of process B where we achieved short carrier lifetime along with temperature and gas flow details. The pressure during the growth was 300 Torr.

TABLE 2

| | | Gas Flow | | | | |
|---|---|---|---|---|---|---|
| Stage | Process | Temperature (° C.) | Time (min) | Silane/dichlorosilane effective flow rate (sccm) | Propane (slm) | Hydrogen (slm) |
| AB | Heating | 1350 | 12 | 0 | 0 | 6 |
| BC | Heating | 1550 | 6 | 0 | 0.022 | 6 |
| CD | Pre growth etching | 1550 | 5 | 0 | 0 | 6 |
| DE | Growth | 1550 | 60 | 3.5 | 0.05 | 6 |
| EF | cooling | 750 | 18 | 0 | 0.022 | 6 |

In both the processes, after reaching 750° C., the furnace was allowed to cool to room temperature in 20 minutes. Then, it was filled with argon to a pressure of 750 Torr and finally sample was taken out.

The temperature and time of annealing in carbon rich atmosphere is not limited to the one described in this patent application. The work applies to growth and annealing temperature ranging from 1400-1900° C. The SiC samples need not be limited to 8° off-cut but can be any degree off-cut (from 0-90° off-cut).

Results & Discussion

The present inventors have shown that the graphite parts with TaC can help to minimize the incorporation of the impurities (e.g., Ti, B, and/or Al). Although the TSC measurements were not conclusive in this regard, sample grown using TaC-coated susceptor resulted in higher carrier lifetime. Moreover, the combination of a chlorine-based precursor in conjunction with a TaC-coated susceptor can further help to improve the carrier lifetime since chlorine-based precursors have been reported to result in lower densities of lifetime-killing defects.

Additionally, the present inventors have shown that dichlorosilane (DCS) aids in increasing the carrier lifetime substantially when compared to typical silane/propane growth under similar growth conditions. A detailed description of the samples and precursors/susceptor used is given in Table 3.

TABLE 3

| Sample | Thickness (μm) | Net Doping (cm−3) | Exp. Set up (Susceptor coating and Silicon Source) | Lifetime (μs) |
|---|---|---|---|---|
| A | 19 | 6.00E+15 | SiC coating with Chlorinated Precursor | 0.81 |
| B | 20 | 9.00E+15 | SiC coating with Silane Precursor | 0.247 |
| C | 20 | 7.00E+15 | TaC coating with Silane Precursor | 3.3 |
| D | 21 | 5.00E+15 | TaC coating with Chlorinated Precursor | 9.9 |

Figure 5:
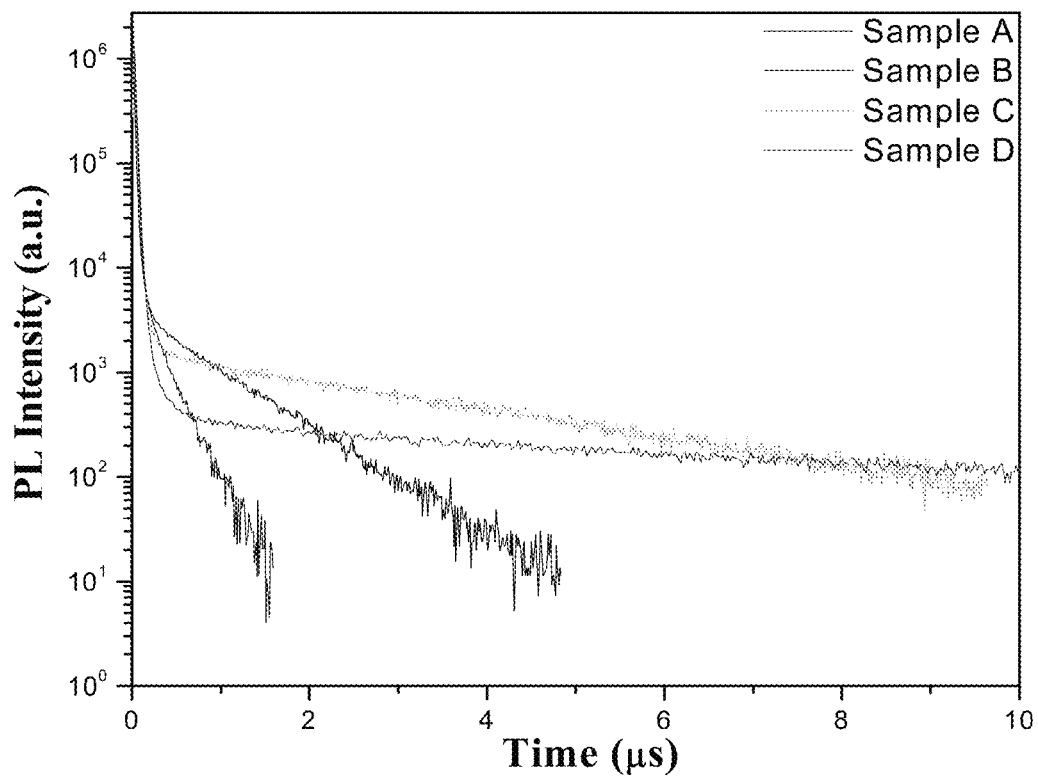
FIG. 5 shows PL decays for n⁻ epilayers with varying lifetimes.
Figure 6:
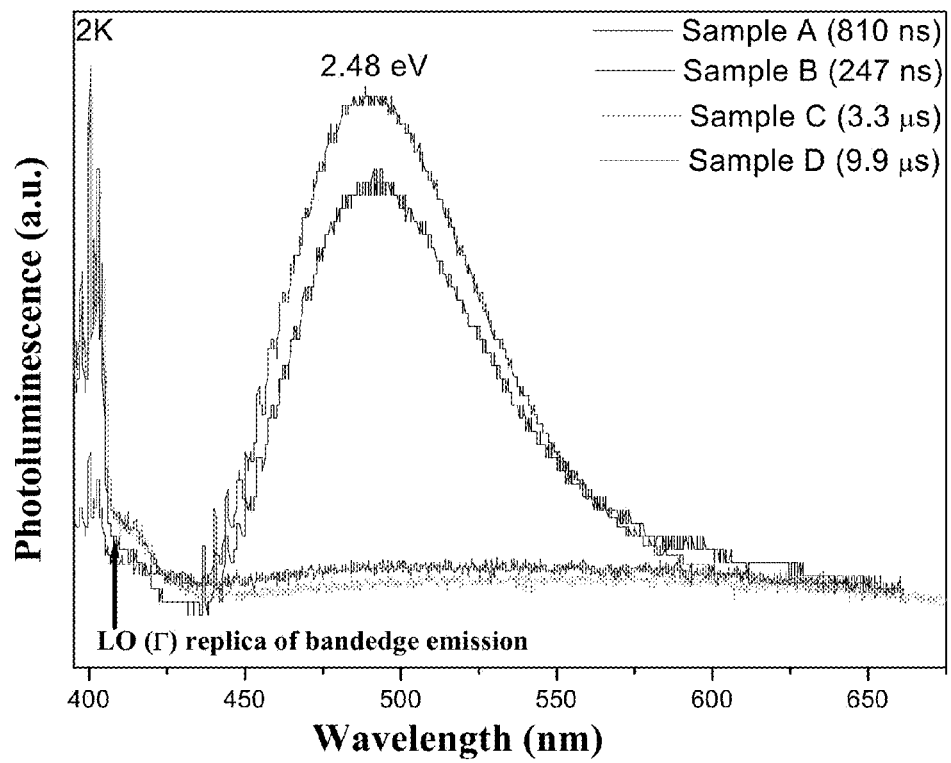
FIG. 6 shows LTPL spectra for same epilayers.

It was found that by using DCS coupled with the TaC-coated graphite susceptor high (9.9 μs) carrier lifetimes could be obtained. The PL decays from the four samples, obtained at relatively low injection, are presented in FIG. 5 (the fast initial decay is due to the substrate). Since the PL injection level is considerably lower than the majority carrier concentration, the measured lifetime corresponds to the minority carrier lifetime in the as-grown epilayers. As can be seen from Table 3 and FIG. 5, for a given susceptor type, the carrier lifetime is higher for epilayers grown using DCS instead of silane and similarly for a given precursor the carrier lifetime increases when using a TaC-coated susceptor instead of a SiC-coated susceptor. There also appears to be an interesting correlation between the low temperature visible PL (see FIG. 6) spectra and the carrier lifetimes. The longer lifetime samples exhibited very weak defect PL, while for both of the shorter lifetime samples (both grown using the SiC-coated susceptor) the defect band at 499 nm (2.48 eV) was significantly broader and more intense. These two samples exhibiting the intense 499 nm PL band could be due to Ti incorporation, although nitrogen-boron donor-acceptor pair recombination (N—B DAP's) is also a possibility.

TSC was done to identify the deep level traps. Although a couple of deep traps were observed, but at this preliminary stage it was not possible to correlate the defects with the lifetimes. Deep level transient spectroscopy (DLTS) will be done to identify the traps level. It is not clear whether the lifetimes are limited by defects and/or by the surface recombination, but surface recombination has to be considered and that the variations that we see in lifetime could be strongly affected by the surface. Next, attempts will be made to identify the specific trap levels using DLTS in order to correlate the lifetime with defects and their concentrations This new applied technology takes full advantage of the unique properties of SiC material for the fabrication of bipolar devices such as PiN diodes and BJTs requiring high carrier lifetime for conductivity modulation as well as unipolar devices such as Schottky diodes requiring shorter carrier lifetime without significant power losses, not possible before.

These and other modifications and variations to the present invention may be practiced by those of ordinary skill in the art, without departing from the spirit and scope of the present invention, which is more particularly set forth in the appended claims. In addition, it should be understood the aspects of the various embodiments may be interchanged both in whole or in part. Furthermore, those of ordinary skill in the art will appreciate that the foregoing description is by way of example only, and is not intended to limit the invention so further described in the appended claims.

What is claimed:

1. A substrate, comprising:
  a substrate body defining a surface;
  a first carbon deposit directly on the surface of the substrate body, wherein the first carbon deposit is formed in a temperature increase atmosphere that consists essentially of a first carbon source gas and a carrier gas, at least a portion of the first carbon deposit being diffused into the substrate body to fill one or more defects therein;
  a silicon carbide epitaxial layer directly on the first carbon deposit; and
  a second carbon deposit directly on the silicon carbide epitaxial layer, wherein the second carbon deposit is formed in a temperature decrease atmosphere that consists essentially of a second carbon source gas and a carrier gas, at least a portion of the second carbon deposit being diffused into the silicon carbide epitaxial layer to fill one or more defects therein.

2. The substrate of claim 1, wherein the silicon carbide epitaxial layer has a carrier lifetime between about 0.25 μs and about 9.9 μs.

3. The substrate of claim 1, wherein the silicon carbide epitaxial layer has a carrier lifetime between about 1 μs to about 9.5 μs.

4. The substrate of claim 1, wherein the silicon carbide epitaxial layer has a carrier lifetime between about 5 μs to about 9 μs.

5. The substrate of claim 1, wherein the substrate body comprises silicon carbide.

6. The substrate of claim 5, wherein the silicon carbide has a crystal structure that defines a hexagonal unit cell.

* * * * *